(12) United States Patent
Karin

(10) Patent No.: US 10,848,050 B2
(45) Date of Patent: Nov. 24, 2020

(54) MODULE-LEVEL SHUTDOWN ELECTRONICS COMBINED WITH MODULE-LEVEL INVERTER FOR PHOTOVOLTAIC ENERGY SYSTEMS

(71) Applicant: PALO ALTO RESEARCH CENTER INCORPORATED, Palo Alto, CA (US)

(72) Inventor: Todd Karin, Fairfield, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 0 days.

(21) Appl. No.: 16/216,712

(22) Filed: Dec. 11, 2018

(65) Prior Publication Data

US 2020/0007077 A1 Jan. 2, 2020

Related U.S. Application Data

(60) Provisional application No. 62/693,236, filed on Jul. 2, 2018.

(51) Int. Cl.
| | |
|---|---|
| *H02S 40/32* | (2014.01) |
| *H02J 3/38* | (2006.01) |
| *H02M 7/537* | (2006.01) |
| *H01L 31/02* | (2006.01) |
| *H01L 31/05* | (2014.01) |
| *H02M 1/12* | (2006.01) |
| *H02M 7/00* | (2006.01) |

(Continued)

(52) U.S. Cl.
CPC ........ *H02M 1/12* (2013.01); *H01L 31/02021* (2013.01); *H01L 31/0504* (2013.01);
(Continued)

(58) Field of Classification Search
CPC .......... H02S 40/30; H02S 40/32; H02S 40/34; H02S 40/36; H02S 10/00; H02J 3/383;
(Continued)

(56) References Cited

U.S. PATENT DOCUMENTS

| | | |
|---|---|---|
| 5,193,054 A | 3/1993 | Galloway et al. |
| 5,345,375 A | 9/1994 | Mohan |

(Continued)

OTHER PUBLICATIONS

Benaifa et al., "Analysis of Harmonic Reduction for Synchronized Phase-shifted Parallel PWM Inverters with Current Sharing Reactors," 2007 IEEE Canada Electrical Power Conference, pp. 134-139.

(Continued)

*Primary Examiner* — Thienvu V Tran
*Assistant Examiner* — Ivan Laboy
(74) *Attorney, Agent, or Firm* — Miller Nash Graham & Dunn LLP

(57) ABSTRACT

A power system includes at least one power unit, and each power unit has a direct current power source comprising at least two photovoltaic modules connected in series, each module having a positive and a negative output terminal, and a distributed inverter consisting of and an associated transistor switches connected to either the positive or negative output terminal of the at least two photovoltaic modules, and an alternating current power output. A power system has at least two power units, and each power unit has a direct current power source of at least one photovoltaic modules, and at least two transistor switches, wherein each power unit produces one polarity of voltage, used for generating alternating current power.

6 Claims, 7 Drawing Sheets

(51) Int. Cl.
*H03K 17/687* (2006.01)
*H02M 7/49* (2007.01)
*H02S 40/36* (2014.01)
*H02S 40/34* (2014.01)

(52) U.S. Cl.
CPC ............. *H02J 3/383* (2013.01); *H02M 7/003* (2013.01); *H02M 7/006* (2013.01); *H02M 7/537* (2013.01); *H02S 40/32* (2014.12); *H03K 17/687* (2013.01); *H02M 7/49* (2013.01); *H02S 40/34* (2014.12); *H02S 40/36* (2014.12)

(58) Field of Classification Search
CPC ............... H02J 3/385; H01L 31/02021; H01L 31/0504; H02M 7/42; H02M 7/48; H02M 7/4807; H02M 7/4826; H02M 7/487; H02M 7/49; H02M 7/493; H02M 7/497; H02M 7/501; H02M 7/53; H02M 7/533; H02M 7/537; H02M 7/5387; H02M 7/53871

See application file for complete search history.

(56) References Cited

U.S. PATENT DOCUMENTS 5,434,771 A 7/1995 Danby et al.
2004/0208029 A1 10/2004 Caruthers et al.
2006/0245221 A1 11/2006 Ohshima et al.
2009/0185400 A1 7/2009 Okui
2009/0283129 A1 11/2009 Foss
2012/0113696 A1* 5/2012 Voigtlaender ..... H02M 7/53871
363/71
2012/0307528 A1 12/2012 Humphrey et al.
2013/0033907 A1 2/2013 Zhou et al.
2013/0285457 A1* 10/2013 Kepley ................... H02J 3/385
307/77
2013/0320767 A1* 12/2013 Huang .................... H02J 3/383
307/77
2015/0047686 A1* 2/2015 Eickelmann .......... H01L 31/072
136/244
2016/0006392 A1* 1/2016 Hoft ........................ H02S 50/10
361/78
2017/0054297 A1* 2/2017 Narla ....................... H02J 3/383
2017/0229871 A1* 8/2017 Liu .......................... H02J 3/383
2017/0294864 A1 10/2017 Tada et al.
2019/0036141 A1 1/2019 Yamane

OTHER PUBLICATIONS

Bierk et al., "Characterization of Distortion Reduction for Single0Phase Multiple Inverter Operation," 2007 IEEE Canadian Conference on Electrical and Computer Engineering, Vancouver, BC, pp. 713-716.
U.S. Appl. No. 16/216,694, filed Dec. 11, 2018.

* cited by examiner

MODULE-LEVEL SHUTDOWN ELECTRONICS COMBINED WITH MODULE-LEVEL INVERTER FOR PHOTOVOLTAIC ENERGY SYSTEMS

RELATED APPLICATIONS

This application is a continuation of, and claims priority to, U.S. Provisional Patent Application No. 62/693,236, filed 2 Jul. 2018, which is incorporated by reference in here in its entirety.

TECHNICAL FIELD

This disclosure relates to inverters, more particularly to reducing electronic components in inverters.

BACKGROUND

Solar power provides a renewable energy source with potential to provide a relatively inexpensive, almost unlimited, source of power. Photovoltaic (PV) cells form the basic building blocks of PV panels, where the PV cells are arranged in arrays. These arrays are typically referred to as photovoltaic panels or photovoltaic arrays.

The National Electric Code (NEC) 2014 requires rapid shutdown of voltage to under 30 volts for any conductor within 10 feet of photovoltaic array within 10 seconds. The NEC 2017 requires rapid shutdown within of voltage to under 30 V for any conductor within 1 foot of a photovoltaic array within 30 seconds. One state-of-the-art plan to meet NEC 2017 requirements is to include a MOSFET (metal oxide semiconductor field effect transistor) switch located within 1 foot of the photovoltaic panel, typically located on the rear of the panel itself. This transistor switches on or off based on whether a rapid shutdown is required.

Typically, inverters are used to convert direct current (DC) power generated from photovoltaics, to alternating current (AC) power. Many possible architectures for these inverters exist, but a common architecture involves a three-phase, half-bridge inverter, having 6 transistors per inverter. When the system has a large set of PV arrays and correspondingly a large number of inverters, the number of transistors multiplies with each inverter. Given the new requirements for rapid shutdown in NEC 2017, there is an opportunity to combine the transistor conventionally used for rapid shutdown with the transistors conventionally used in the power inverter. A reduction in the number of transistors would reduce the complexity and cost of the system.

SUMMARY

According to aspects illustrated here, a power system is provided that includes at least one power unit, and each power unit has a direct current power source comprising at least two photovoltaic modules connected in series, each module having a positive and a negative output terminal, and a distributed inverter consisting of and an associated transistor switches connected to either the positive or negative output terminal of the at least two photovoltaic modules, and an output comprising at least single phase power.

According to aspects illustrated here, a power system is provided that has at least two power units, and each power unit has a direct current power source of at least one photovoltaic modules, and at least two transistor switches, wherein each power unit produces one polarity of voltage, used for generating alternating current power.

DETAILED DESCRIPTION OF THE EMBODIMENTS

Figure 1:
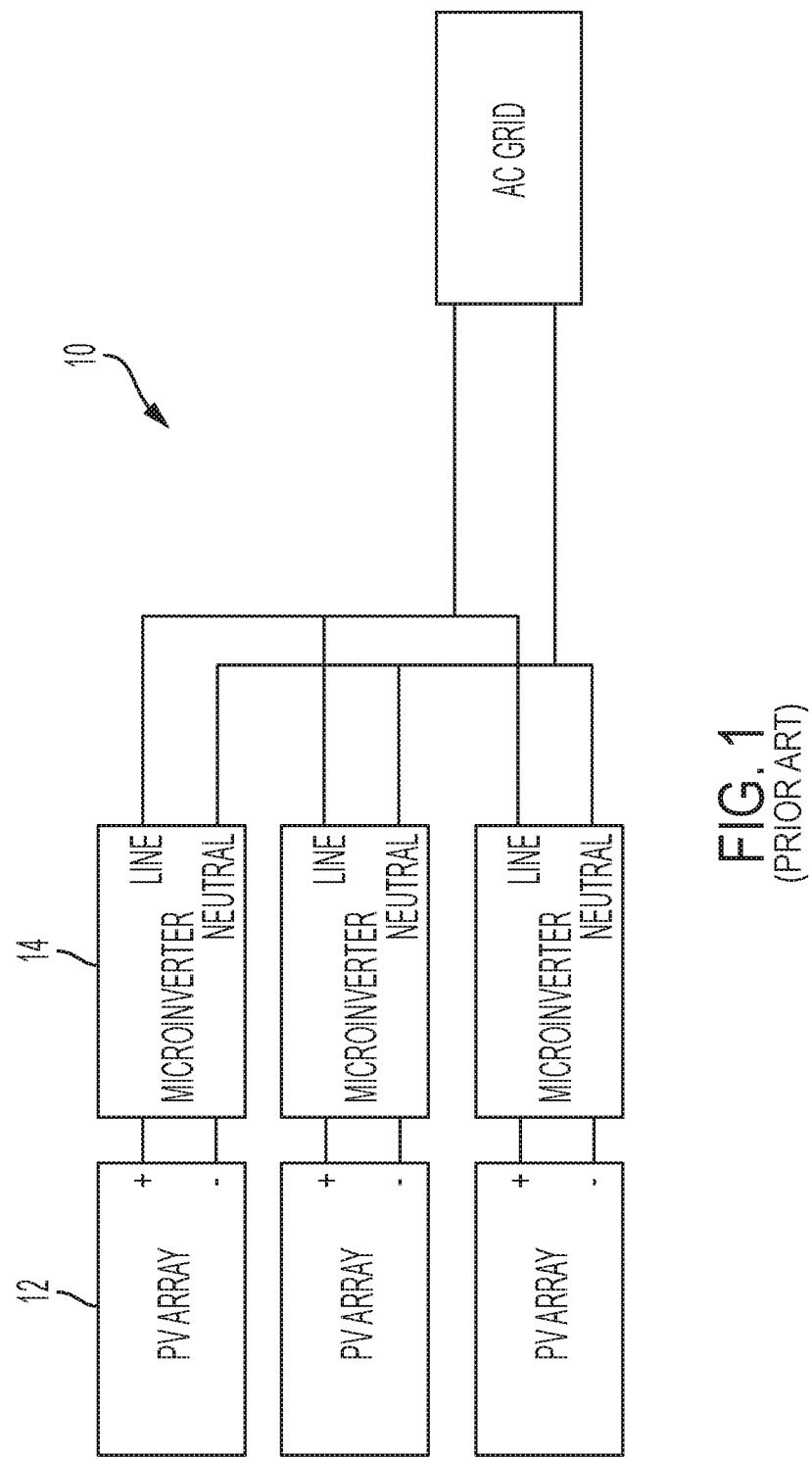
FIG. 1 shows a prior-art example of a single-phase microinverter photovoltaic system.
Figure 2:
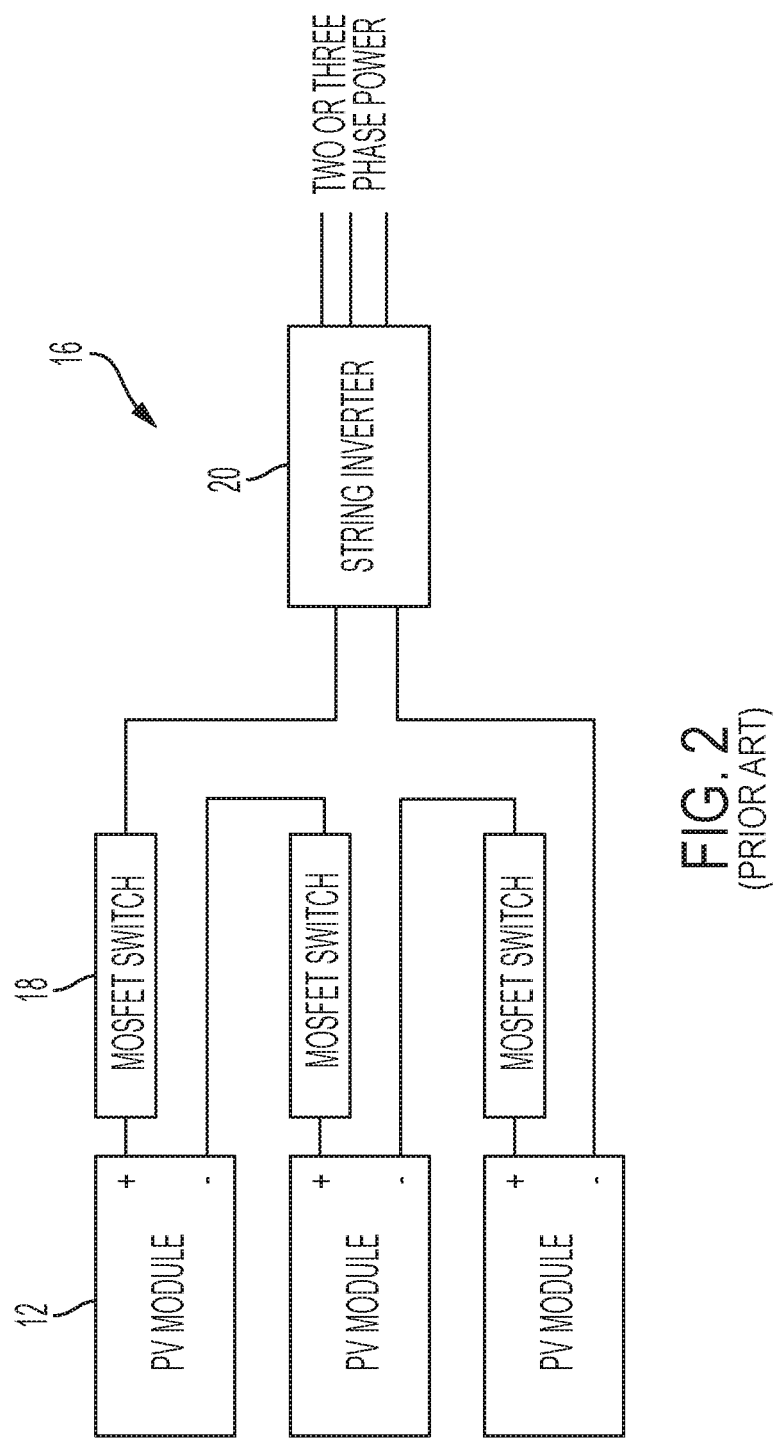
FIG. 2 shows a prior-art example of a single-phase or three-phase string-inverter photovoltaic system.

The embodiments here use a novel architecture referred to as a 'distributed inverter.' FIG. 1 shows a prior art example of a photovoltaic system 10 with microinverters, where each photovoltaic (PV) array such as 12 each has an inverter such as 14. If rapid shutdown is necessary, each microinverter can turn off its output. FIG. 2 shows a prior-art example of a typical way that rapid shutdown could be implemented in a string-inverter architecture 16 having a string inverter 20. If rapid shutdown is necessary each of the MOSFET switches such as 18 connected to at PV array such as 12 can turn off. In general any type of semiconductor switch or mechanical disconnector can be used.

Figure 3:
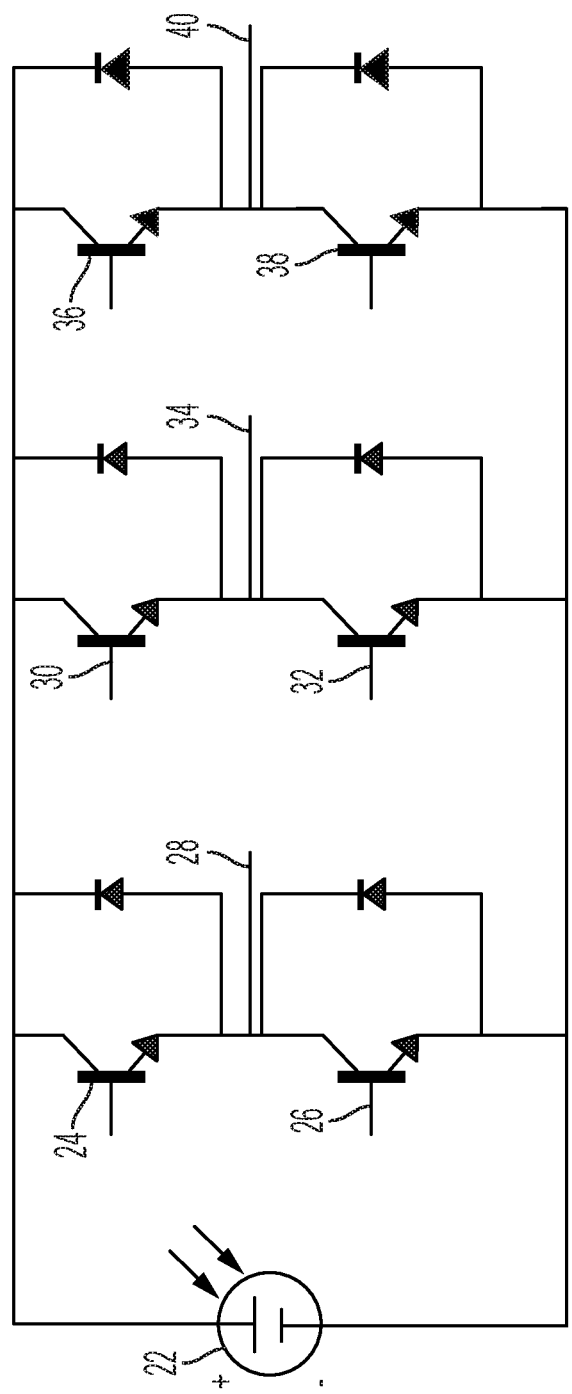
FIG. 3 shows a prior art example of a three-phase half-bridge inverter.

FIG. 3 shows an example of a prior art, three-phase, half-bridge inverter. In these figures, for ease of discussion and simplification of the drawings the PV panel or panels and all the associated circuitry, for example DC to DC converters, is represented as a photovoltaic module shown as 22. The associated circuitry may include a DC to DC converter in order to increase the voltage to an appropriate level. The transistors 24 and 26 produce a first phase signal 28, transistors 30 and 32 produce a second phase signal 34, and transistors 36 and 38 produce the third-phase signal 40. The three-phase output signal is a series of three sine waves, each phase offset from each other, and has both a positive polarity portion and a negative polarity portion. A single phase inverter could be implemented by removing two transistors and their associated diodes, for example 36, 38 and 40.

The example shown in FIG. 3 uses 6 transistors. This number of transistors would be multiplied for each set of PV arrays, which leads to a high number of transistors, which increases the total system cost. It would be desirable to reduce the component count.

Figure 6:
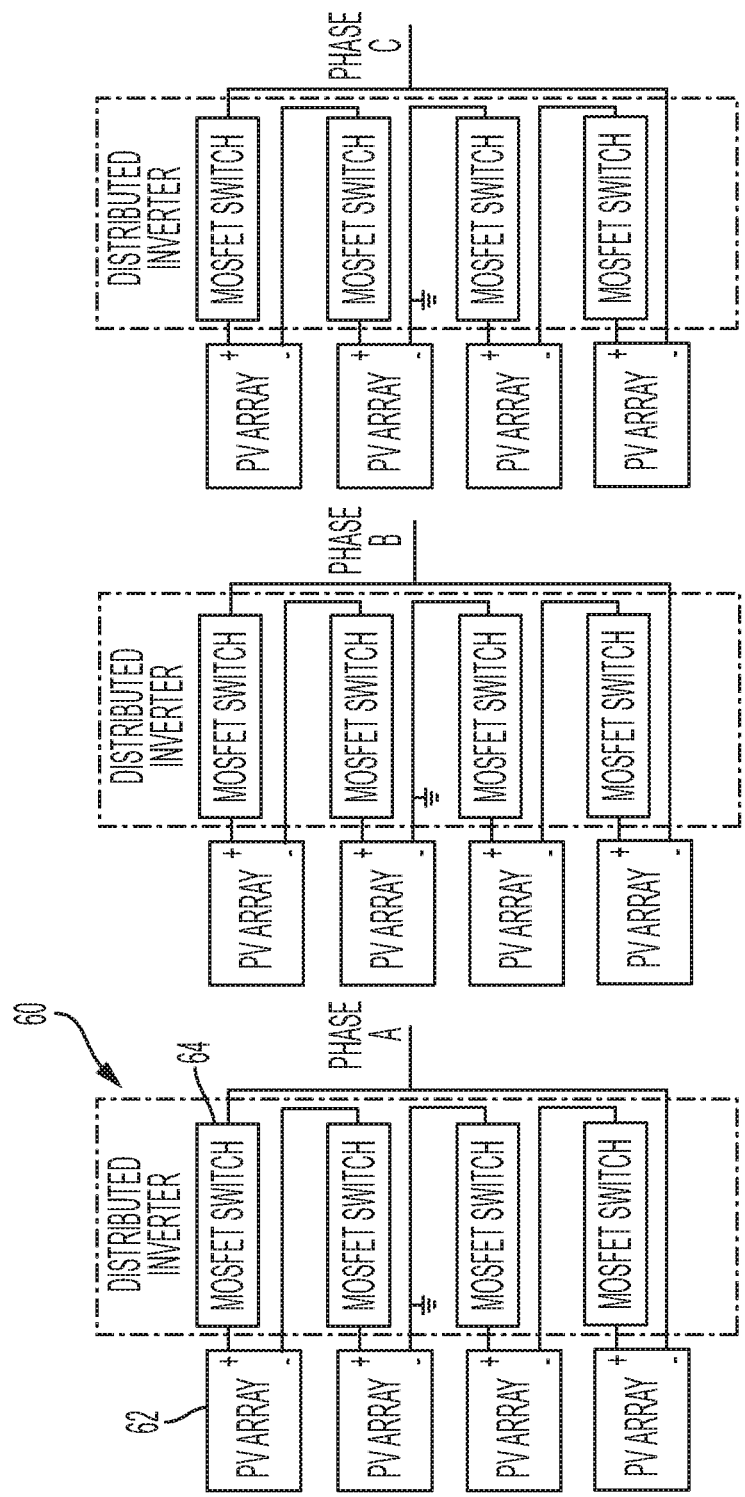
FIG. 6 shows an embodiment of a three-phase distributed inverter.
Figure 7:
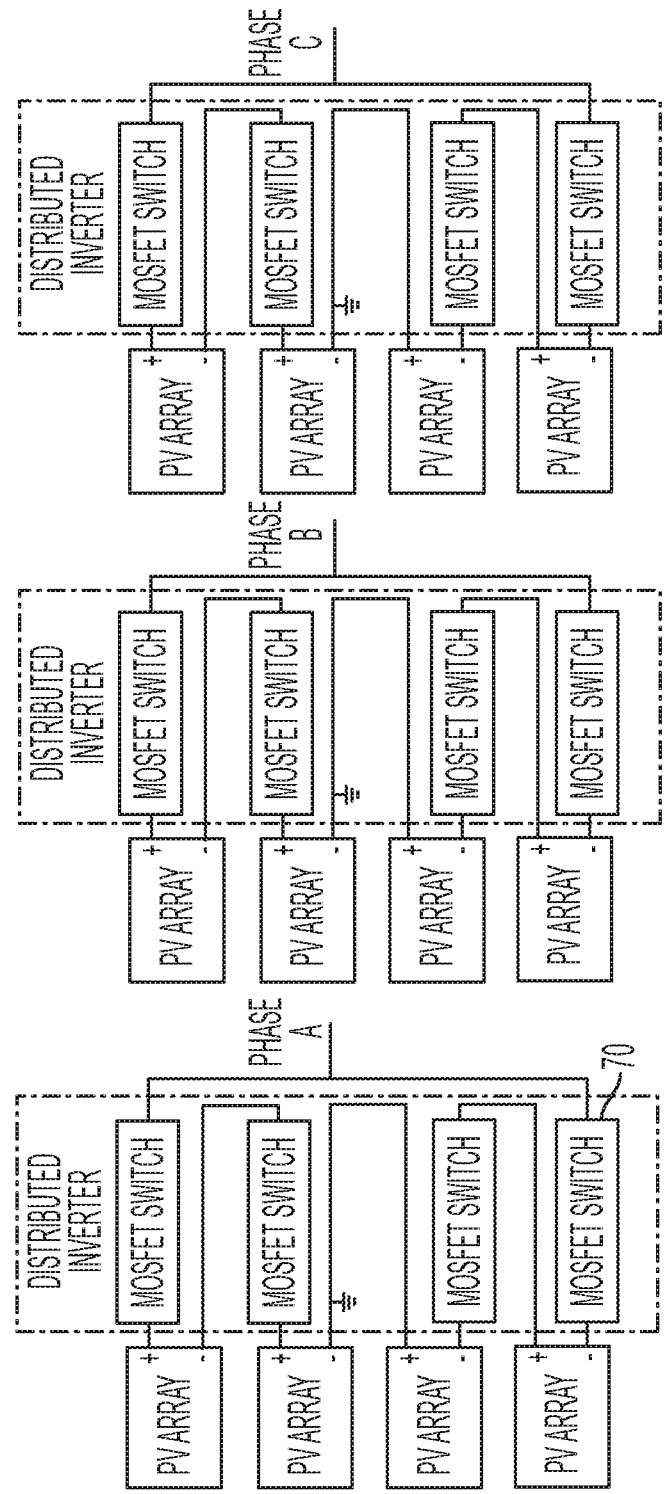
FIG. 7 shows a second embodiment of a three-phase distributed inverter.

The component count can be reduced by distributing the transistors amongst multiple inverters. FIG. 6 shows an embodiment of incorporating multiple transistor switches, shown as MOSFETS (metal oxide semiconductor field effect transistors) such as 64, into a single distributed inverter. In general, any type of transistor may be used, including possibly a flyback diode or other circuitry. FIG. 6 shows four solar modules such as 62 in series, however any even number of modules in series is also possible. It is also possible to achieve: a distributed single-phase inverter by using just phase output a; a distributed single-phase full-bridge inverter using phase outputs a and b; or a three-phase half-bridge inverter by using phase outputs a, b, and c. It should be noted that the phase outputs a, b, and c will often not be a sine wave with low total harmonic distortion, and additional low-pass or band-pass filtering may be required to bring total harmonic distortion to an acceptably low level. It is also possible to change the location of the semiconductor switches to the negative terminal of the solar module as shown in FIG. 7 at 70. The units such as 60 shown in this embodiment could be repeated as needed for systems with larger numbers of photovoltaic panels.

In general, since current flows through the PV module, the MOSFETs may be placed adjacent to the positive or negative terminal of the module in any arbitrary variation on all PV modules. The MOSFETs can be connected to the + or − terminal on any of the modules as shown in FIG. 7. In FIG. 7, the MOSFET is connected to the positive terminals of some PV modules, and the negative terminals in others. Similar to FIG. 6, the MOSFETS could also be attached only to the negative terminals of the PV modules.

Figure 4:
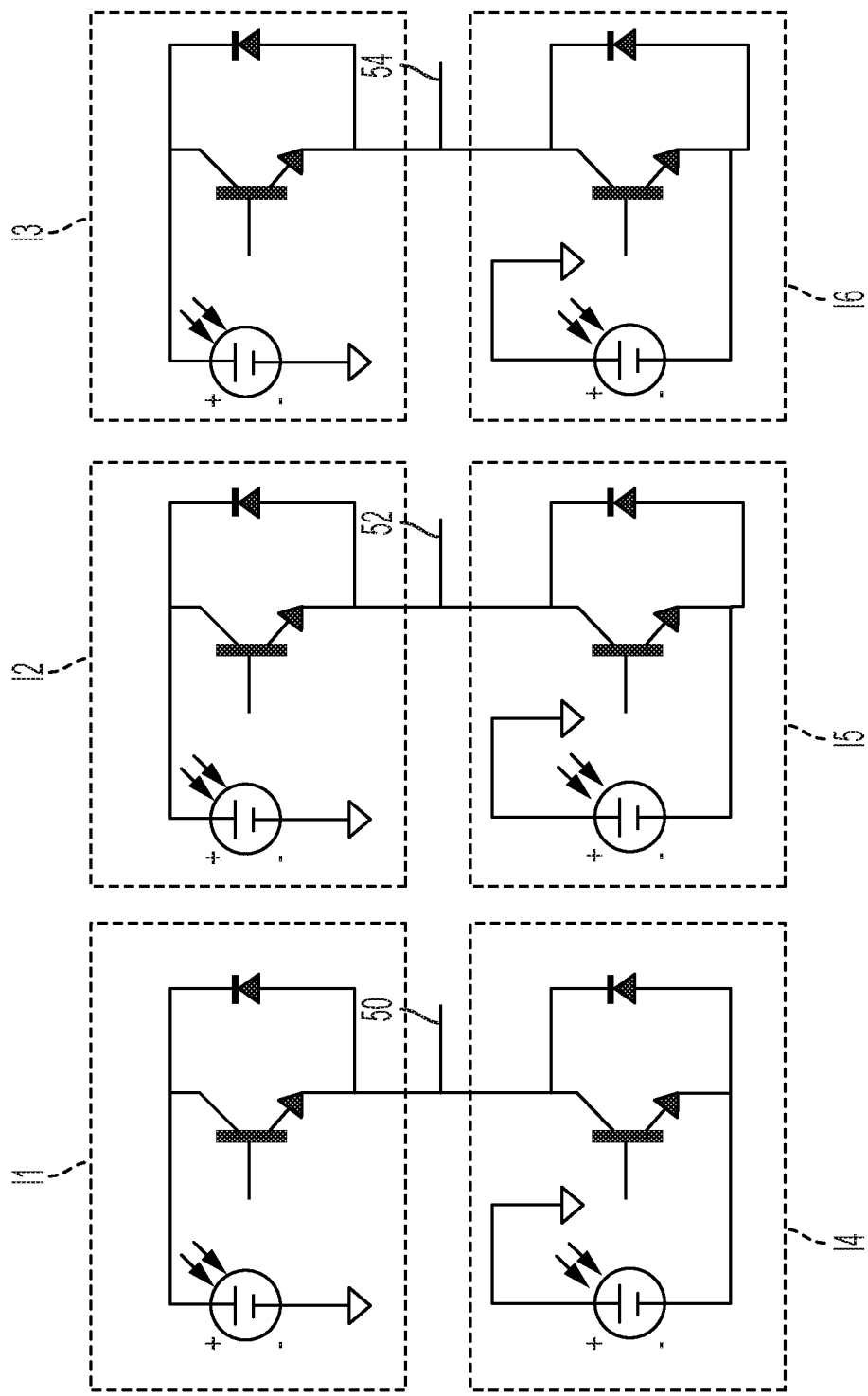
FIG. 4 shows a first embodiment of a distributed inverter architecture.

FIG. 4 shows a more detailed example of one circuit embodiment for a distributed three-phase half-bridge inverter. The six inverters I1 through 16 form a single distributed inverter, in this case a three-phase inverter. This unit shown in the embodiment of FIG. 4 could form a base unit that could then be multiplied as needed. This architecture combines quick disconnect and inverter functionality and reduces the component count. The reduction is present even without taking into account the additional transistor used for quick disconnect. The reduction in cost is not just related to the number of transistors. The transistors used for quick disconnect are low power transistors and are much less expensive than the transistors such as used in a string inverter as in FIG. 2. Rapid shutdown can be accomplished simply by turning off all the transistors.

The transistor switch times are calculated using existing methods for determining switch times of pulse-width modulation inverters. It is notable that multilevel converter methods cannot be applied directly to the architectures in FIGS. 6 and 7.

In FIG. 4, each inverter produces one polarity of one phase. The phase outputs 50 (a), 52 (b), and 54 (c), provide the three-phase output AC signals. In the embodiments here, the polarity is controlled by the grounding of the photovoltaic array, which may be negatively grounded or positively grounded. This can be seen by contrasting the architectures of one of the positive inverters, such as I1, to one of the negative inverters, such as 14. It is also possible to replace the ground connection with a "neutral" wire that connects all points on the diagram currently represented by a ground, but is itself ungrounded. This may have advantages for preventing corrosion by decoupling the photovoltaic power leads from the ground connection and avoiding making an electrochemical cell.

In addition, if one were to remove the inverters 13 and 16, then the distributed inverter can be controlled as a single-phase, full-bridge inverter. The embodiments shown here can also be used for single-phase power with modification.

Figure 5:
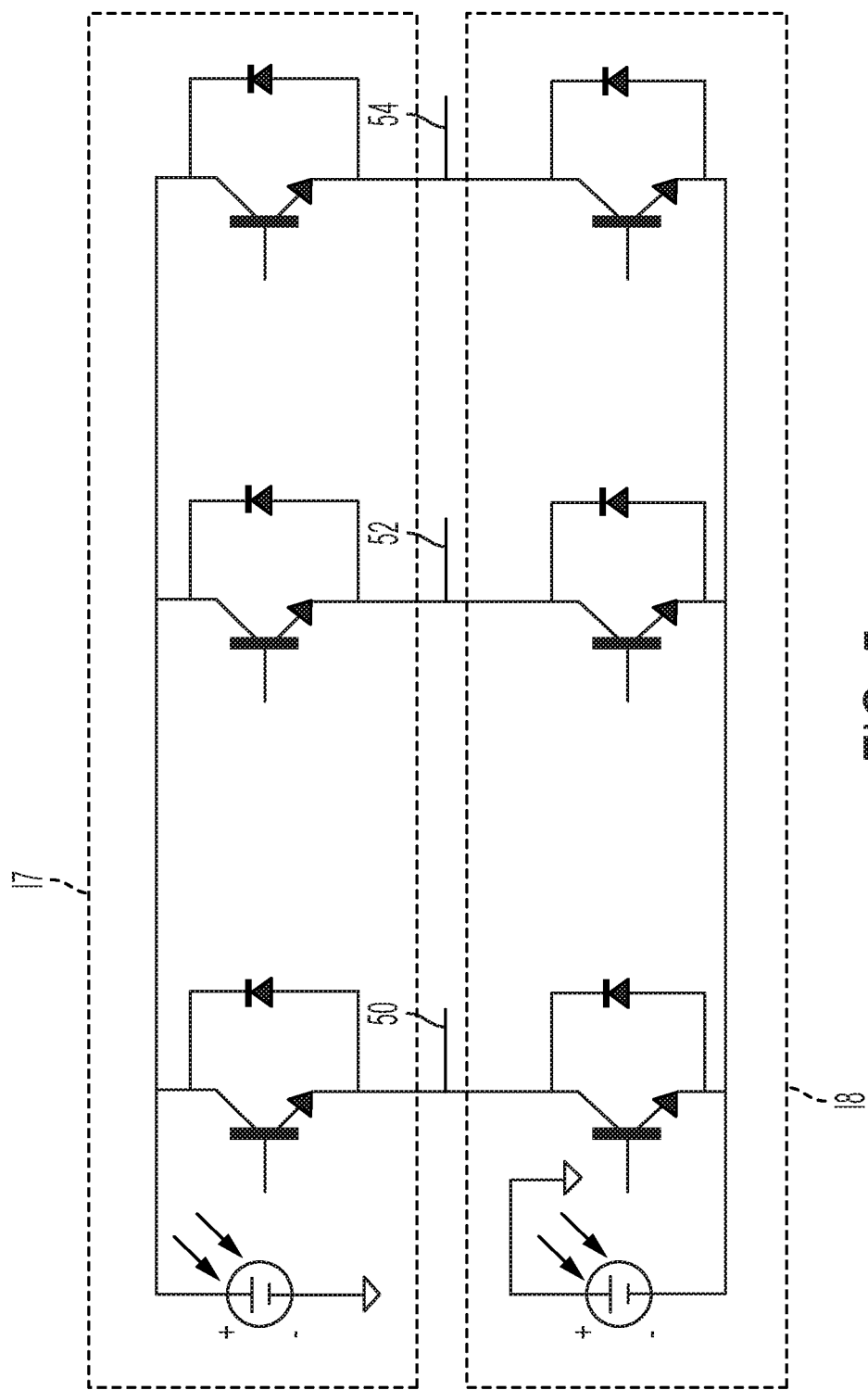
FIG. 5 shows a second embodiment of a distributed inverter architecture.

FIG. 5 shows an alternative embodiment of a distributed inverter. In this embodiment, two inverters, 17 and 18, each have three transistors and the phase outputs are 50, 52 and 54. In this embodiment, each inverter generates one polarity of voltage, and the three phases are connected externally.

In this manner, one can combine the quick-disconnect switches with the architecture of the inverters. This meets the requirement of providing quick-disconnect, while reducing the transistor count. This reduces the complexity and cost of the solar power systems.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

What is claimed is:

1. A power system, comprising: an alternating current power output; and at least one power unit, each power unit comprising: a direct current power source comprising more than two photovoltaic modules connected in series, each of the more than two photovoltaic modules having a positive output terminal and a negative output terminal; and a distributed inverter consisting of transistor switches connected to the photovoltaic modules, each photovoltaic module having at least one transistor switch directly connected to one of either the positive output terminal or the negative output terminal of the photovoltaic module, wherein some transistor switches are directly connected to the alternating current power output, each transistor switch configured to allow disconnection of each photovoltaic module, where at least two of the photovoltaic modules differ in which of the positive output terminal or negative terminal of the photovoltaic module is connected to the transistor switch.

2. The power system of claim 1, wherein the at least one power unit comprises three power units and the alternating current power output comprises three phase power.

3. The power system of claim 1, wherein the at least one power unit comprises two power units and the alternating power output comprises single-phase power.

4. The power unit of claim 1, wherein the more than two photovoltaic modules and associated transistor switches comprise an even number of photovoltaic modules and associated transistor switches connected in series.

5. The power system of claim 1 where the transistor switch further includes a flyback diode connected in parallel.

6. A power system, comprising: three power units, each power unit comprising: a direct current power source comprising more than two photovoltaic modules; and
a distributed inverter consisting of transistor switches connected to the photovoltaic modules, each photovoltaic module having at least one transistor switch directly connected to one of either a positive output terminal or a negative output terminal of the photovoltaic module, wherein some transistor switches are directly connected to an alternating current power output, where at least two of the photovoltaic modules differ in which of the positive output terminal or the negative terminal of the photovoltaic module is connected to the transistor switch, and wherein each power unit produces one phase of voltage for the alternating current power output from the transistor switches.

* * * * *